(12) United States Patent
Franke

(10) Patent No.: US 7,620,512 B2
(45) Date of Patent: Nov. 17, 2009

(54) DETERMINING A TIME BASE FOR A MICROCONTROLLER

(75) Inventor: Michael Franke, Darmstadt (DE)

(73) Assignee: Braun GmbH, Kronberg (DE)

( * ) Notice: Subject to any disclaimer, the term of this patent is extended or adjusted under 35 U.S.C. 154(b) by 226 days.

(21) Appl. No.: 11/912,087

(22) PCT Filed: Mar. 18, 2006

(86) PCT No.: PCT/EP2006/002513

§ 371 (c)(1),
(2), (4) Date: Oct. 19, 2007

(87) PCT Pub. No.: WO2006/111231

PCT Pub. Date: Oct. 26, 2006

(65) Prior Publication Data
US 2008/0186073 A1    Aug. 7, 2008

(30) Foreign Application Priority Data
Apr. 20, 2005 (DE) .................. 10 2005 018 518

(51) Int. Cl.
*G06F 1/04* (2006.01)
(52) U.S. Cl. ............... 702/79; 702/65; 702/85; 702/191; 702/105; 702/176; 324/677; 324/676; 324/678; 327/291
(58) Field of Classification Search ........... 702/79, 702/65, 85, 191, 105, 176; 341/167, 168; 327/291; 324/677, 676, 678, 663, 661, 686; 368/113, 118; 361/290; 700/82, 16; 714/14
See application file for complete search history.

(56) References Cited

U.S. PATENT DOCUMENTS

| | | | | |
|---|---|---|---|---|
| 3,747,089 A * | 7/1973 | Sharples | ...................... | 341/167 |
| 4,349,832 A * | 9/1982 | Gallo | .......................... | 348/500 |
| 5,119,347 A * | 6/1992 | Portmann | .................... | 368/113 |
| 5,238,184 A * | 8/1993 | Adams | ......................... | 236/94 |
| 5,325,315 A * | 6/1994 | Engel et al. | ................. | 702/105 |
| 5,329,239 A * | 7/1994 | Kindermann et al. | ....... | 324/678 |
| 5,469,364 A * | 11/1995 | Hughey et al. | ............... | 702/65 |
| 5,586,042 A * | 12/1996 | Pisau et al. | ................... | 702/65 |
| 5,702,426 A | 12/1997 | Pons et al. | | |
| 5,825,648 A * | 10/1998 | Karnowski | ................... | 700/82 |
| 2005/0035772 A1* | 2/2005 | Bauer et al. | ................. | 324/712 |
| 2007/0194840 A1* | 8/2007 | Dathe et al. | ................. | 327/552 |

(Continued)

FOREIGN PATENT DOCUMENTS

DE    28 38 969    3/1980

(Continued)

*Primary Examiner*—Carol S Tsai
(74) *Attorney, Agent, or Firm*—Fish & Richardson P.C.

(57) ABSTRACT

The invention relates to a method for producing a time base for a microcontroller and a simple circuit arrangement therefor, which comprises an RC-element having a specific time constant, said element being connected to a connection of the microcontroller. According to said method, the capacitor of the RC element is charged to an initial voltage in a first step, then in a second step, the number of timed impulses is counted until the voltage on the capacitor falls below the initial voltage to a determined percentage of the initial voltage or a voltage threshold value, and then in a third step, the counted number of timed impulses is used as a time base.

20 Claims, 1 Drawing Sheet

U.S. PATENT DOCUMENTS

2008/0191794 A1 * 8/2008 Chiu et al. .................. 327/553

FOREIGN PATENT DOCUMENTS

| DE | 29 23 026 | 12/1980 |
| DE | 2 10 775 | 6/1984 |
| DE | 44 20 998 | 12/1995 |
| DE | 197 44 893 | 5/1998 |
| DE | 102 60 244 | 7/2004 |
| WO | WO2004/070937 | 8/2004 |

* cited by examiner

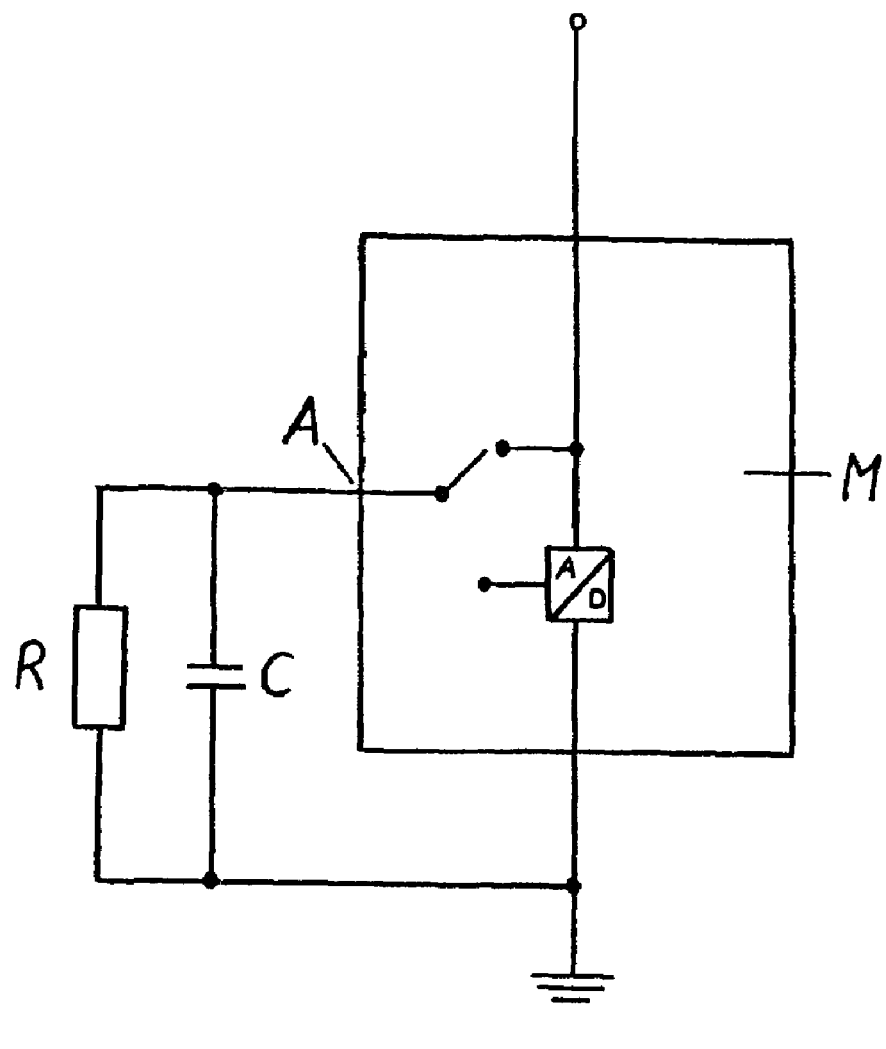
Fig.

DETERMINING A TIME BASE FOR A MICROCONTROLLER

BACKGROUND

The invention relates to a method for producing a time base for a microcontroller and a simple circuit arrangement therefor.

In DE 102 60 244 A1 a method for time measurement in an electronic device is disclosed, incorporating a timer component with an RC-oscillator is disclosed. A capacitor of an RC-element is charged and discharged via a resistance of the RC-element. The voltage at the capacitor describes an exponential charging and discharge curve. On reaching a threshold voltage the timer component switches an output into the opposite state (HIGH or LOW), so that a square wave voltage is produced at the output, the frequency of which is specified by the values of the RC-element. As this frequency is too inaccurate to be used as a time base, a correction figure is determined, with the aid of which a corrected time base is calculated. For this purpose the electronic device additionally incorporates a microcontroller with a quarts or ceramic oscillator unit, which generates a second frequency with better stability than the timer component, but is only operative temporarily, in order to save power. The correction figure is determined by comparing the two frequencies from time to time.

Many microcontrollers with an external quartz or resonator require appropriate installation space, or can be particularly expensive if their dimensions are small. There are also microcontrollers that have an internal RC-oscillator, and therefore rather small dimensions. In many microcontrollers, the clock frequency is dependent on the operating voltage and the temperature, and can therefore vary by over +/− 30%. Moreover, the current consumption of these microcontrollers can be considered too nigh for use in battery-operated devices.

SUMMARY

One aspect of the present invention features a simple method for producing a relatively accurate time base for a microcontroller, the clock generator of which has a comparatively unstable oscillation frequency.

Implementing this aspect of the inventive method in electronic circuitry requires only an RC-element, with a known time constant, connected to the microcontroller. The microcontroller includes a clock generator, realized using internal and/or external components.

The RC-element itself can also be integrated into the microcontroller. This allows the method to be implemented in electronic circuitry very cost-effectively.

This aspect of the inventive method includes the following stages. In a first stage, one capacitor or the RC-element is charged by the microcontroller up to a starting voltage. In a second stage, the microcontroller counts the number of clock pulses of its clock generator for as long as it takes until the voltage on the capacitor of the RC-element has fallen from the starting voltage down to a specified percentage of the starting voltage or to a threshold voltage. In a third stage, the counted number of clock pulses is used as a time base and preferably stored in a non-volatile memory.

Another aspect of the invention features a circuit arrangement for producing a time base for a microcontroller with an internal clock generator. The circuit arrangement includes an RC-element, with a known time constant, connected to the microcontroller. In this circuit arrangement, the voltage of the capacitor can be measured by an A/D-converter included in the microcontroller. A capacitor in the RC-element is first charged up until the A/D-converter indicates a starting voltage has been reached. Then, the number of clock pulses is counted for as long as it takes the voltage on the capacitor of the RC-element to fall from the starting voltage down to a specified percentage of the starting voltage or to a threshold voltage as measured by the A/D-converter. The number of clock pulses counted is then used as a time base for the microcontroller.

The invention will now be explained with the aid of an exemplary embodiment for a particularly advantageous circuit arrangement, which is illustrated in the only drawing.

BRIEF DESCRIPTION OF THE DRAWING

The FIGURE illustrates an exemplary embodiment of a circuit arrangement for producing a time base for a microcontroller with an internal clock generator.

DETAILED DESCRIPTION

The circuit arrangement shown in the FIGURE has only a microcontroller M and an RC-element that is connected to a connection A of the microcontroller. The microcontroller contains a pulse generator in the standard manner. The connection of the microcontroller is reversible; i.e., it can be used as an output or as an input connection. In the first stage of the method, the connection is switched as an output, and the capacitor C of the RC-element is charged up by the microcontroller to a starting voltage. In the second stage of the method, the connection is switched as an input, and the RC-element is connected to a device for measuring the voltage applied to the RC-element. For example, the RC-element may be connected to the input of an A/D-converter. The A/D-converter continuously converts the voltage on the capacitor of the RC-element into a numerical value, which, starting from a starting value corresponding to the starting voltage, continuously decreases as the capacitor C of the RC-element discharges via the resistance R of the RC-element. At the same time, the microcontroller counts the number of clock pulses of its clock generator for as long as it takes until the voltage on the capacitor of the RC-element has fallen from the starting voltage down to a specified percentage of the starting voltage; i.e., the A/D-converter supplies a numerical value that corresponds to a percentage of the starting value stored in the microcontroller. In the third stage, the number of clock pulses counted is preferably stored in a non-volatile memory end then used as a time base so that the commands to be executed by the microcontroller can be time-dependently controlled. The accuracy of this time base is specified by the accuracy of the time constants of the RC-element and not by the comparatively unstable oscillation frequency of the clock generator of the microcontroller.

The accuracy of this method is based on the well-known characteristic of an RC-element of having a time constant that is the most independent of temperature and voltage; i.e., the voltage or the RC-element when the capacitor C discharges through the resistor R, involves an exponential function with a virtually temperature-independent time constant so that the duration of a discharge of the capacitor from a starting voltage to a specified percentage of the starring voltage is always constant, i.e. independent of the level of the starting voltage. In this way, the time constant of the RC-element is therefore independent of the microcontroller supply voltage. Under the assumption that the microcontroller supply voltage, at least during the discharge process, is constant, the ratio between the starting value supplied by the A/D-converter and the specified percentage of the starting value is constant, i.e. independent of the supply voltage, as the values supplied by the A/D-converter are related to the supply voltage of the microcontroller.

In another embodiment of a suitable circuit arrangement, the RC-element is connected to an output and an input of the microcontroller. The capacitor of the RC-element can be charged up by the microcontroller through the output while a diode, present at the output, prevents the capacitor from being able to discharge again through the output. At the output of the microcontroller, a device is arranged for measuring the voltage applied to the capacitor of the RC-element as already described above.

In other variants of a suitable circuit arrangement, the connection or input of the microcontroller, to which the RC-element is connected, has connected to it not only the voltage measuring device but also a device for comparing the voltage applied to the capacitor of the RC-element with a reference voltage.

The method, can be modified so that, the microcontroller can be operated in a power-saving mode without losing its time information in the process. In an appropriately modified exemplary embodiment, the RC-element is connected to an interrupt input of the microcontroller, with which the microcontroller is woken up from the power-saving mode if the voltage on the RC-element has fallen to a threshold voltage.

The first three stages of the modified method are virtually the same as already described above. In the first step, the capacitor of the RC-element is charged up by the microcontroller to a starting voltage. In the second stage, the microcontroller counts the number of clock pulses of its clock generator until the voltage on the capacitor of the RC-element has fallen from the starting voltage down to the threshold voltage that would trigger an interrupt in the power-saving mode. In the third step, the number of clock pulses counted is stored. In a fourth stage, the capacitor or the RC-element is charged up to the starting voltage again. In a fifth stage, the microcontroller is transferred to the power-saving mode, i.e. the clock generator of the microcontroller is also switched off. When the voltage on the capacitor has fallen from the starting voltage down to a voltage threshold value in a sixth stage, an interrupt is triggered, end the microcontroller is woken up from the power-saving mode. If required, in a seventh step, a time counter can be allowed to count up further by the amount stored in the third stage. By repeating stages four to seven, the microcontroller can also be transferred into the power-saving mode multiple times, one after the other and each for the duration of a discharge process of the capacitor of the RC-element, without it losing its knowledge of the time elapsed during this process.

In an especially preferred configuration, the microcontroller is operated in a way such that the stages of the method described above are combined together and are followed multiple times in sequence as described in the following. In if this way, cheap microcontrollers can be used for applications for which they otherwise would, not have been applicable due to their inadequate time stability or their high power consumption.

With stages one to three, a time base is obtained, after first charging the capacitor of the RC-element, by counting the number of clock pulses until the voltage on the capacitor of the RC-element has fallen from the starting voltage down to a specified percentage of the starting voltage. Then, the corresponding number of clock pulses is stored in a preferably non-volatile memory. Subsequently, the microcontroller can execute the commands for which it is provided in a known way. After a certain amount of time, stages one to three are repeated in order to take account of possible variations of the microcontroller supply voltage or of the temperature that may have occurred in the meantime.

If the microcontroller is to be put into its power-saving mode, the period during which the microcontroller is to remain in the power-saving mode must first be defined, i.e. with stages one to three of the above method. After charging the capacitor of the RC-element, the number of clock pulses is counted, until the voltage on the capacitor of the RC-element has fallen from the starting voltage down to the threshold voltage that would trigger an interrupt in the power-saving mode, and the number of clock pulses counted is stored in a further, preferably non-volatile, memory. The number of clock pulses corresponding to the period of a power-saving cycle can, if required, be related to the previously determined time base. For example, a power-saving cycle can last exactly the same length as the time base or a specific percentage of the time base. Subsequently, the microcontroller can either immediately follow stages four to six or four to seven of the above method, i.e. remain in power-saving mode for one cycle, or first execute the necessary commands for which it is provided. After this, the microcontroller can again either immediately follow stages four to six or four to seven of the above method, i.e. remain in power-saving mode for a further cycle, or first execute the necessary commands for which it is provided.

After a certain period of time, stages one to three are repeated; i.e., the time base is again generated and/or the time period determined, during which the microcontroller is to remain in the power-saving mode, in order to take account of possible variations of the microcontroller supply voltage or of the temperature that may have occurred in the meantime.

The invention claimed is:

1. A method for producing a time base for a microcontroller with a clock generator for a clock signal and an RC-element with a certain time constant, the method comprising:
   charging a capacitor of the RC-element to a starting voltage;
   counting a number of pulses of the clock signal as the voltage on the capacitor of the RC-element falls to a predetermined percentage of the starting voltage or to a predetermined threshold voltage; and then
   determining the time base as a function of the counted number of clock pulses.

2. The method of claim 1, wherein the predetermined voltage threshold is defined by an interrupt triggering threshold of the microcontroller.

3. The method of claim 2, further comprising:
   recharging the capacitor of the RC-element to the starting voltage;
   causing the microcontroller to initiate a power-saving mode; waiting until the voltage across the capacitor falls to the predetermined percentage of the starting voltage or the predetermined voltage threshold; and then
   causing the microcontroller to exit the power-saving mode.

4. The method of claim 3, further comprising incrementing a time counter by an amount corresponding to the determined time base.

5. The method of claim 4, repeated multiple times in sequence.

6. A time base determination circuit for a microcontroller with an internal clock generator that generates a clock signal, the circuit comprising:
   an external RC-element, including a capacitor and having a certain time constant;
   the RC-element electrically connected to the microcontroller wherein the capacitor is charged to a starting voltage, a number of pulses of the clock signal is counted as the voltage across the capacitor of the RC-element falls to a predetermined percentage of the starting voltage or to a predetermined threshold voltage, and the time base is determined as a function of the counted number of clock pulses.

7. The circuit of claim 6, wherein the RC-element is electrically connected to a connection of the microcontroller, and the connection is both an output and an input of the microcontroller.

8. The circuit of claim 6, wherein the capacitor of the RC-element is charged by the microcontroller.

9. The circuit of claim 6, wherein the voltage across the capacitor of the RC-element is measured by the microcontroller.

10. A time base determination circuit for a microcontroller with an internal clock generator that generates a clock signal and a non-volatile memory, the circuit comprising:
   an RC-element, including a capacitor and having a certain time constant;
   the RC-element electrically connected to the microcontroller wherein the capacitor is charged to a starting voltage, a number of pulses of the clock signal is counted as the voltage across the capacitor of the RC-element falls to a predetermined percentage of the starting voltage or to a predetermined threshold voltage, the counted number of clock pulses is stored in the non-volatile memory, and the time base is determined as a function of the counted number of clock pulses.

11. The circuit of claim 10, wherein the RC-element is external to the microcontroller and is connected to an input/output connection of the microcontroller.

12. The circuit of claim 10, wherein the RC-element is external to the microcontroller and is connected to an input connection and an output connection of the microcontroller.

13. The circuit of claim 10, further comprising an A/D converter for measuring the voltage across the capacitor of the RC-element.

14. A time base determination circuit for a microcontroller with an internal clock generator, the circuit comprising:
   an RC-element, including a capacitor and having a certain time constant; and
   an internal A/D converter for measuring a voltage applied to the RC-element;
   the RC-element electrically connected to the A/D converter and the microcontroller wherein the capacitor is charged to a starting voltage, a number of clock pulses generated by the clock generator is counted as the voltage across the capacitor of the RC-element falls to a predetermined percentage of the starting voltage or to a predetermined threshold voltage, and the time base is determined as a function of the number of clock pulses counted.

15. The circuit of claim 14, wherein the RC-element is internal to the microcontroller.

16. The circuit of claim 14, wherein the RC-element is external to the microcontroller and is connected to an input connection and an output connection of the microcontroller.

17. The circuit of claim 16, wherein the capacitor of the RC-element is charged by the microcontroller.

18. The circuit arrangement of claim 14, further comprising a time counter, wherein the capacitor of the RC-element is recharged to the starting voltage, the microcontroller is transferred into a power-saving mode until the voltage across the capacitor falls to the predetermined threshold voltage, the microcontroller exits the power-saving mode, and the time counter is incremented by an amount corresponding to the time base.

19. A time base determination circuit for a microcontroller with an internal clock generator, the circuit comprising:
   an RC-element, including a capacitor and having a certain time constant; and
   an internal A/D converter for measuring a voltage across the capacitor of the RC-element;
   the RC-dement electrically connected to the A/D converter and the microcontroller wherein the capacitor is charged to a starting voltage, a number of clock pulses generated by the clock generator is counted as the voltage across the capacitor of the RC-element falls to a predetermined threshold voltage, the number of clock pulses counted is stored in a non-volatile memory, the capacitor is recharged to the starting voltage, the clock generator of the microcontroller is switched off, and when the voltage across the capacitor fells to the predetermined threshold voltage, the clock generator is switched on.

20. The circuit arrangement of claim 19, further comprising a time counter having a value, wherein the value is incremented by the number of clock pulses stored in the non-volatile memory for each of a plurality of transitions of the clock generator from off to on.

* * * * *

UNITED STATES PATENT AND TRADEMARK OFFICE
CERTIFICATE OF CORRECTION

PATENT NO. : 7,620,512 B2  Page 1 of 1
APPLICATION NO. : 11/912087
DATED : November 17, 2009
INVENTOR(S) : Michael Franke It is certified that error appears in the above-identified patent and that said Letters Patent is hereby corrected as shown below:

Title Page Item [57] Line 4, after "said" insert --RC--.

Title Page Item [57] Line 6, delete "RC element" and insert --RC-element--.

Column 1

Line 22, delete "quarts" and insert --quartz--.

Line 36, delete "nigh" and insert --high--.

Line 53, delete "one" and insert --the--.

Line 53, delete "or" and insert --of--.

Column 2

Line 48, delete "end" and insert --and--.

Line 57, delete "or" and insert --of--.

Line 58, delete "involves" and insert --follows--.

Line 61, delete "starring" and insert --starting--.

Column 3

Line 36, delete "or" and insert --of--.

Line 42, delete "end" and insert --and--.

Line 54, after the word in, delete "if".

Column 6

Line 29, delete "RC-dement" and insert --RC-element--.

Line 38, delete "fells" and insert --falls--.

Signed and Sealed this

Twenty-second Day of June, 2010

David J. Kappos
*Director of the United States Patent and Trademark Office*